United States Patent [19]

Rowson

[11] Patent Number: 5,251,159
[45] Date of Patent: Oct. 5, 1993

[54] CIRCUIT SIMULATION INTERFACE METHODS

[75] Inventor: James A. Rowson, Fremont, Calif.

[73] Assignee: VLSI Technology, Inc., San Jose, Calif.

[21] Appl. No.: 672,257

[22] Filed: Mar. 20, 1991

[51] Int. Cl.$^5$ .............................................. G06F 15/20
[52] U.S. Cl. .................................. 364/578; 395/157; 395/500
[58] Field of Search ...................... 364/578, 488, 490; 395/157, 500

[56] References Cited

U.S. PATENT DOCUMENTS

| | | | |
|---|---|---|---|
| 4,692,858 | 9/1987 | Redford et al. | 395/157 |
| 4,845,653 | 7/1989 | Conrad et al. | 364/521 |
| 4,970,664 | 11/1990 | Kaiser et al. | 364/488 |
| 5,008,853 | 4/1991 | Bly et al. | 395/157 |
| 5,051,938 | 9/1991 | Hyduke | 364/488 |

OTHER PUBLICATIONS

PCT International Search Report, PCT/US92/01973, RO/US International Filing Date Mar. 12, 1992; Priority Date Claimed Mar. 20, 1991 Applicant: VLSI Technology, Inc.

Primary Examiner—Jack B. Harvey
Assistant Examiner—Ellis B. Ramirez
Attorney, Agent, or Firm—Burns, Doane, Swecker & Mathis

[57] ABSTRACT

In a process for analyzing simulation results and providing such results in terms that are familiar to the circuit designer, user-defined primitives, or tiles, are used to reduce large quantities of simulation data into meaningful information. Incremental simulation results which are acquired during the simulation are distributed to the appropriate tiles using a specialized data structure that includes reporting simulation results from the simulator using a node index.

18 Claims, 3 Drawing Sheets

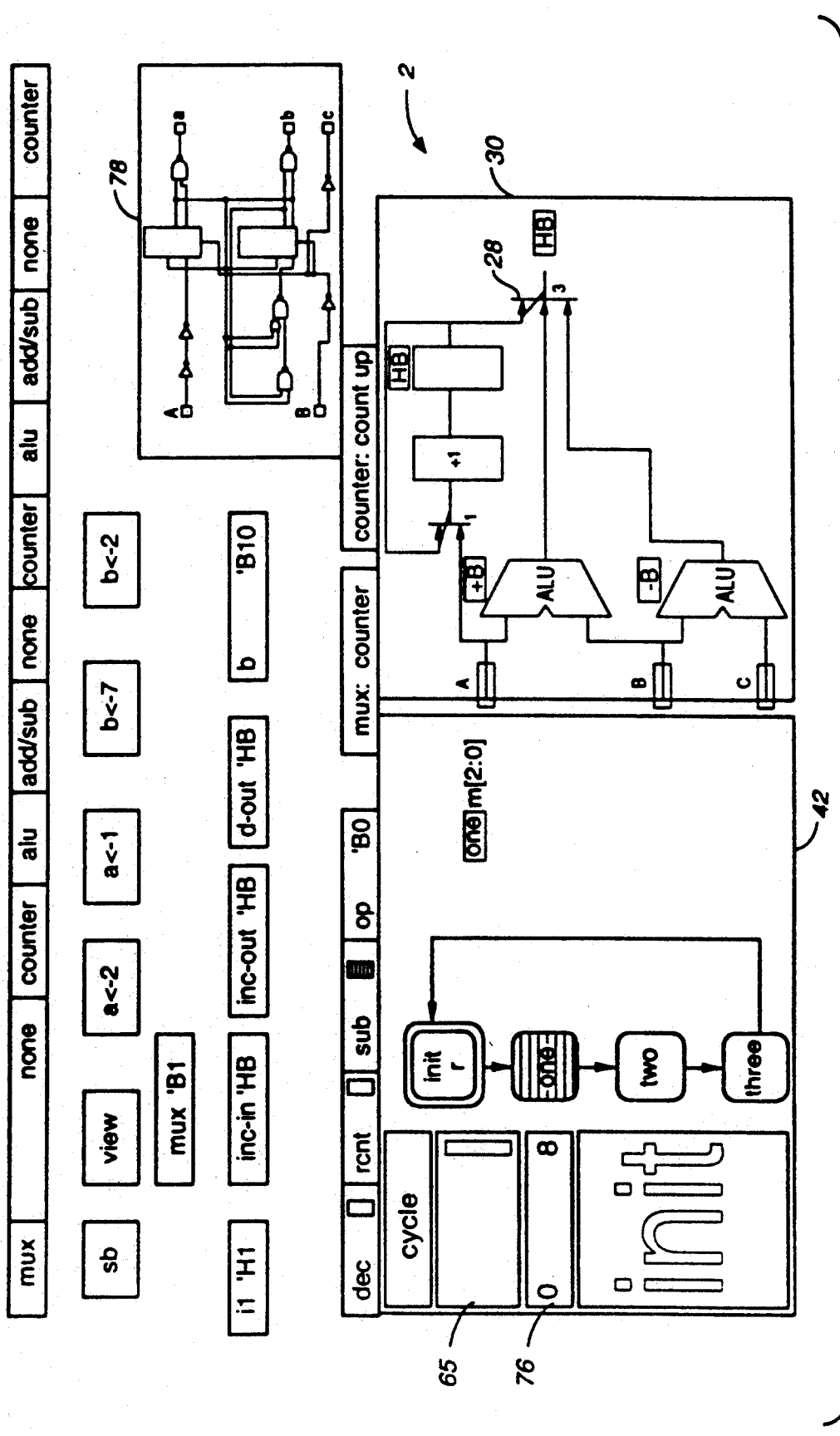
FIG._1

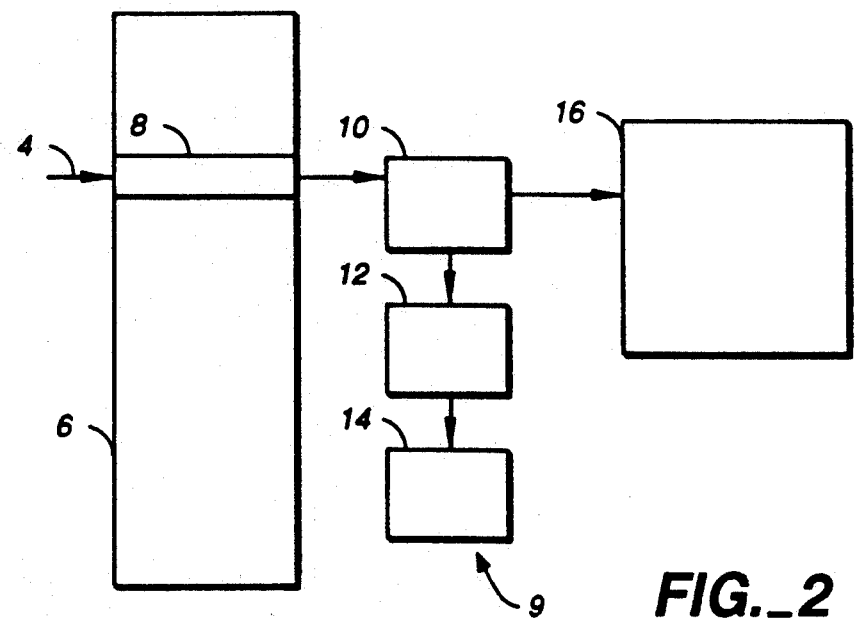
FIG._2
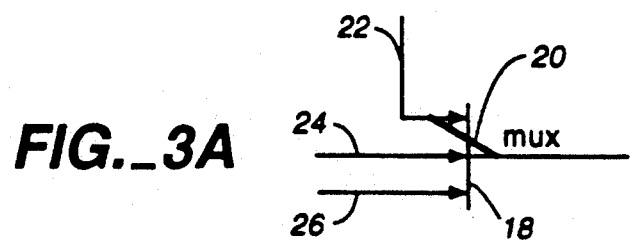
FIG._3A
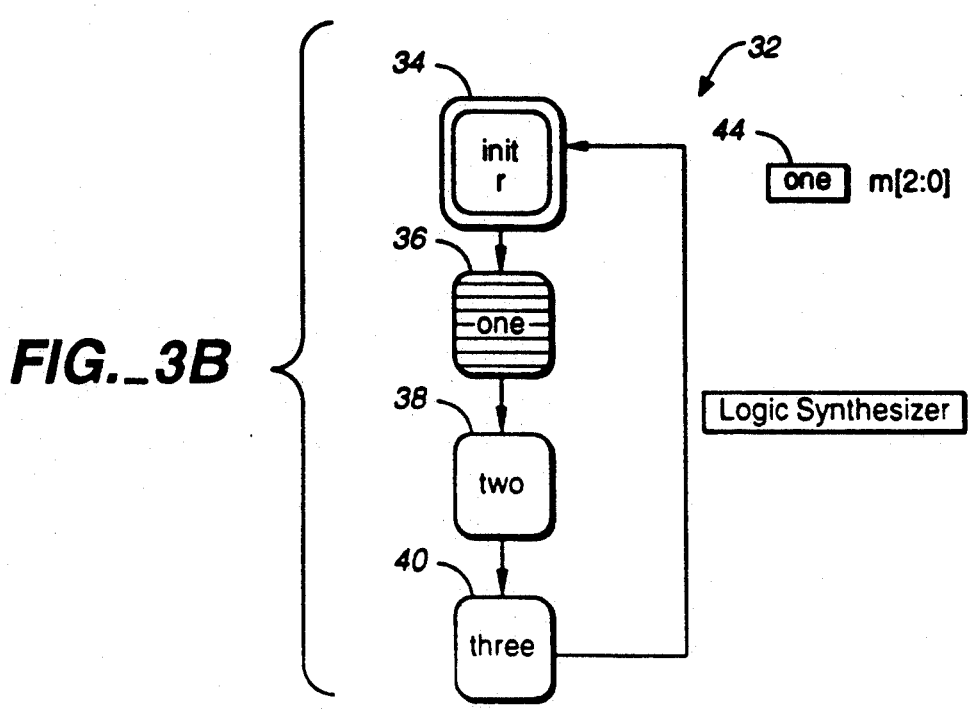
FIG._3B

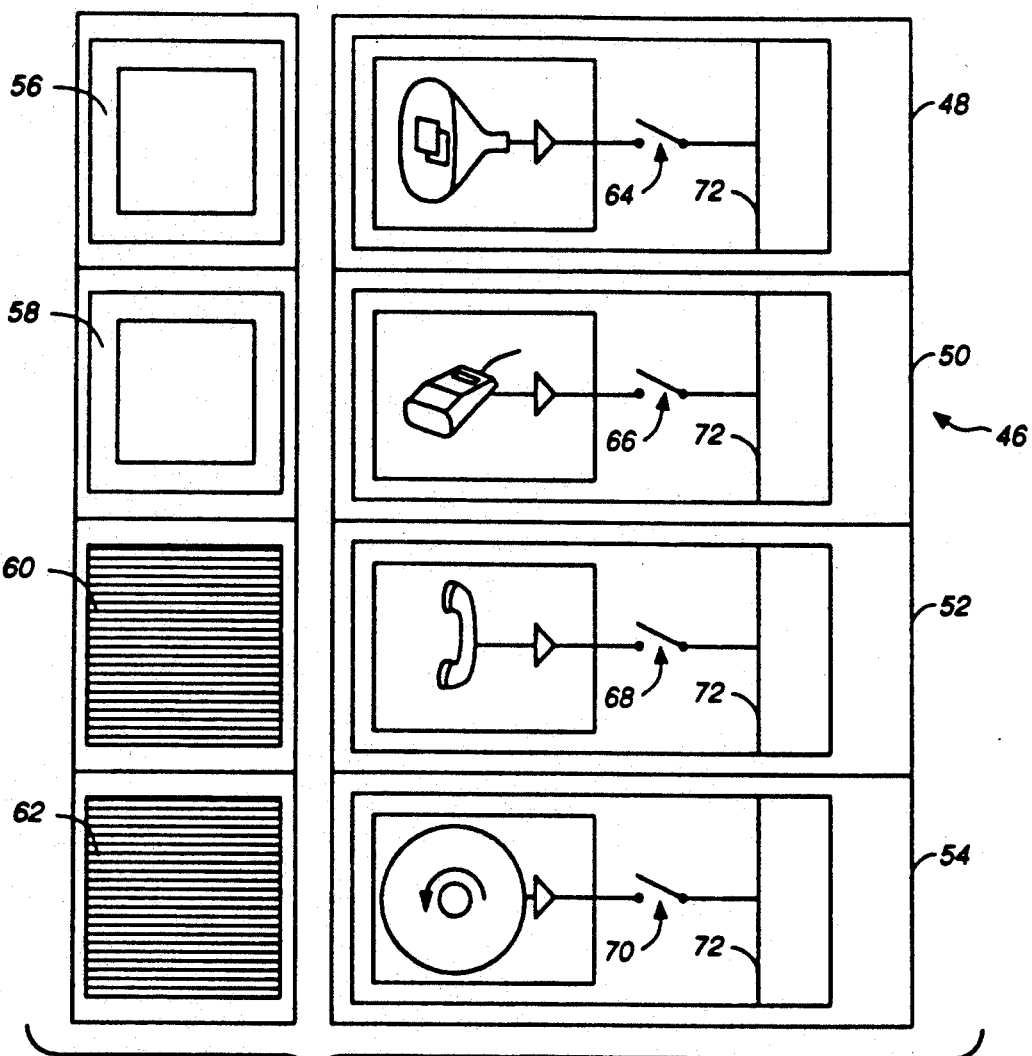
FIG._4
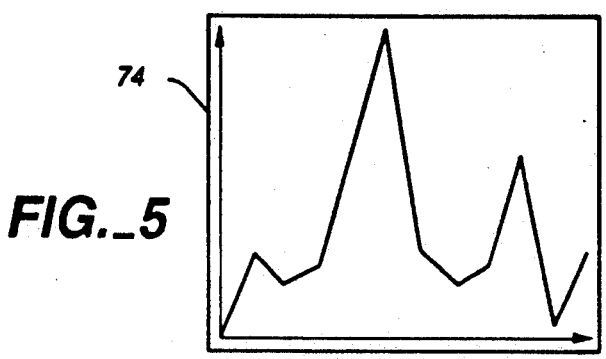
FIG._5
FIG._6A
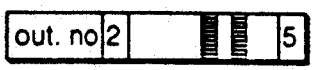
FIG._6B

CIRCUIT SIMULATION INTERFACE METHODS

BACKGROUND OF THE INVENTION

1. Field of the Invention

The present invention generally relates to simulations of electronic circuits such as application specific integrated circuits (ASICs) and, more particularly, to techniques for interpreting results obtained from simulating integrated circuits when gate-level implementations are derived from a higher level implementation (e.g., from a cell-based design).

2. State of the Art

Circuit designers often have difficulty interpreting and analyzing data generated during the simulation of complex integrated circuits. One reason for the difficulty is that simulation data normally is generated in the form of logical 1s and 0s to represent signal states that are present at the nodes of the simulated circuits. Circuit designers ordinarily do not design integrated circuits at the gate level but, instead, design at a high level specification using, for example, logic gate or cell-based implementations. However, although techniques have been suggested for assisting circuit designers in analyzing detailed data derived from simulations of gate-level circuits, none of these techniques provide information that can be correlated with higher level circuit designs.

SUMMARY OF THE INVENTION

The present invention, generally speaking, provides methods for analyzing data generated during the simulation of complex integrated circuits. More particularly, the present invention provides methods that present such data in a form that is meaningful to circuit designers. In addition, the present invention permits a user to define the form in which simulation results are analyzed and presented.

According to the process of the present invention, user-defined primitives, or "tiles," are used to reduce large quantities of simulation data to meaningful information. The invention allows incremental simulation results (i.e., results that are acquired during a simulation) to be distributed to appropriate tiles by a data structure that reports simulation results using a node index.

BRIEF DESCRIPTION OF THE DRAWINGS

The present invention can be further understood with reference to the following description in conjunction with the appended drawings, wherein like elements are provided with the same reference numerals. In the drawings:

FIG. 1 is an illustration of control panel information derived from a circuit during a design simulation;

FIG. 2 shows an exemplary data structuring technique for processing simulation results;

FIGS. 3(a) and (b) show exemplary datapath compiler and logic synthesis tiles for use in a control panel;

FIG. 4 shows an exemplary animation tile;

FIG. 5 shows an exemplary plot of analytical results tile; and,

FIGS. 6(a) and (b) and show exemplary delay specification tiles.

DETAILED DESCRIPTION OF THE PREFERRED EMBODIMENTS

In systems for simulating integrated electronic circuits and the like, simulation results can be presented in a control panel format such as shown in FIG. 1. (As employed herein, the term "control panel" denotes a user interface, or picture, constructed from a set of primitives, or tiles.) The various portions of the control panel represent alternative views of the simulation results. The tiles represent the basic components of the control panel and their form can be defined by the user. Preferably, each tile receives only incremental simulation results (i.e., results generated during each temporal increment of the circuit simulation).

In practice, the tiles can be, for example, annotations on inputs for logic synthesizer tiles and silicon compiler tiles, animation tiles, plot tiles (e.g., graphs) of analyzed simulation results, and delay specification checking tiles. Also, tiles can comprise illustrations of circuit functions (e.g., waveform displays), annotations on gate level schematics, and logic analyzer type displays. Thus, generally speaking, tiles represent any control panel means that can reduce quantities of simulation data to meaningful information. Thus, tiles are not merely displays of 1s and 0s that are generated during circuit simulations.

In practice, a control panel can be composed of any number of tile forms. Further, multiple tiles can be selected to present the same simulation results while interpreting those results in different ways. Thus, by selecting and defining tiles for a control panel, a user can customize an interface to provide meaningful design information. Also, user-defined textual interpretations can be used in conjunction with the tiles.

FIG. 2 shows a data structuring system for processing simulation results. In the system, simulation results are assigned a node index when they are reported from the circuit simulator. (Circuit simulators are devices that test the functionality of a circuit design in response to one or more test vector or signals.) In practice, a node index uniquely identifies each node or junction between two or more circuit components. The node indexes normally are retained in the gate level implementation that is constructed, by a gate level circuit synthesizer or silicon compiler.

Further in the system of FIG. 2, the status of each node in the circuit design is reported with the appropriate node index at each desired time increment during a circuit simulation. More particularly, in the illustrated embodiment, signal 4 represents the status of a node (e.g., binary value of the signal present at that node) along with the node index. This signal is received by an index array 6 that represents an array 8 of tiletie records. (As used herein, the phrase "tiletie record" refers to a pointer for an appropriate tile and a local index value for that file to identify the tile, or tiles, that are associated with the signal.) For present purposes, the array 8 can be understood to comprise a list that includes tileties 10, 12 and 14, all of which are indexed according to the node index.

Once a tile has been identified by the local index contained in a tiletie record, the signal value is passed to the tile. For example, in FIG. 2, the signal value 4 is passed to tile 16 through tiletie 10 in list 8. The tile 16 will then process the signal in the manner ultimately dictated by the circuit designer.

As mentioned above, a tile can comprise an annotation onto logic synthesizer inputs or onto inputs of silicon compilers such as datapath compilers. Both logic synthesizers and silicon compilers typically produce a circuit design output that is specified as a netlist of gates. Using naming conventions, portions of the netlists can be correlated, by name, with signals generated at circuit nodes during simulation of the circuit.

As an example of such correlations, FIG. 3 shows a three input multiplexer identified as "ul" in a datapath picture of a synthesized or compiled circuit will have control signals associated therewith. These control signals may be specified by the names "ul[2:0]" in the simulation. The argument "[2:0]" indicates that three control signal bits are present, any one of which may be active high at a given time to select on of the three multiplexer inputs.

If the individual bit "ul[0]" is high at a given time increment of the simulation, then the schematic representation of the multiplexor can be appropriately modified. For example, if the multiplexor is schematically represented as element 18 in FIG. 3, then a line 20 could be laid over the currently selected input. In the drawing in FIG. 3, the line 20 illustrates that the top input 22 has been selected at the time of the simulation and that the remaining inputs 24 and 26 have not been selected. Because a datapath can be over 32 bits wide, the number of signal lines can be significantly reduced.

If a 32 bit datapath were used in FIG. 3, ninety-six signals can be reduced to a relatively simple graphical annotation that readily illustrates functioning of this circuit component during simulation. The FIG. 3 multiplexor is in a datapath compiler tile 30 of the FIG. 1 control panel.

As illustrated in FIG. 3(b), a technique similar to that described with respect to FIG. 3(a) can be employed in a circuit layout implemented using a logic synthesizer. More particularly, FIG. 3(b) shows a technique that can be employed with a circuit layout implemented using a logic synthesizer. In the drawing, a bubble diagram represented generally as element 32 specifies a state machine that can be implemented, for example, by using a logic synthesizer. In practice, the various states of the state machine are typically encoded into a register of flip-flops, with a different state becoming active in dependence upon the state of all flip-flop outputs at any given time.

To indicate the current state during a simulation, different bubbles in the FIG. 3(b) diagram are highlighted. That is, the simulation results at any given time are the values output from the state register flip flops (e.g., "q" outputs). The appropriate bubble representing the active state is identified by cross correlating the set of flip-flop output values into a unique string which is attributable to the bubble.

The FIG. 3(b) diagram illustrates an initialize (or reset) state 34 followed by three subsequent states 36, 38 and 40 of the state machine. At any given time, only one of these states will be active, depending on the state register flip-flop outputs. For example, following activation of an initialization command, each state can be sequentially made active upon generation of clock pulses. The FIG. 3(b) tile is included in the FIG. 1 control panel as tile 42. The notation 44 in the logic synthesizer tile indicates the possible activation of one of three states identified by a register of three flip flops. Again, as with those tiles discussed above, reducing many diverse signal values in graphical function representations facilitates subsequent circuit debugging.

As mentioned above, another type of tile is an animation tile. FIG. 4 shows an exemplary animation tile as element 46. With this type of tile, values of a set of signals are used to select a picture, pre-entered by the circuit designer, which is then drawn on the control panel with text annotations to provide a graphical interpretation of the graphical output.

FIG. 4 shows a bus arbiter for controlling access to a bus in the circuit design. The bus arbiter is being used to control which of four potential bus users gain control of the bus. In FIG. 4, the four potential users are a video 48, a mouse 50, a modem 52 and a disk 54. Each potential bus user includes an access switch 64, 66, 68 or 70, respectively for connecting the user to the bus 72. The bus user (or users) which has control of the bus is indicated by placing the user 48, 50, 52 or 54 in red and closing the access switch of that user. In FIG. 4, the mouse user 50 has switch 66 closed; in practice, it would be red to reflect bus control.

FIG. 4 also shows bus users that do not have bus control but which have requested bus control. More particularly, bus request indicators 56, 58, 60 and 62 are next to each of the potential bus users. When a potential bus user requests bus control, the bus request indicator can be illuminated in a chosen color, such as red, on the control panel during a circuit simulation. Thus, in the example provided by FIG. 4, the bus request indicators 60 and 62 would be illuminated to indicate that the modem 52 and the disk 54 request bus control at the incremental time.

As mentioned above, a third type of tile comprises plotting of analysis to capture a stream of simulation results and pass them into a user defined calculation routine. Results of the user calculations can be plotted graphically in one dimensional and two dimensional data plots.

FIG. 5 shows an example of a graph 74 of an analytical results tile. In the drawing, a line plot provides a summary of the last N data samples from a bus in the circuit design. The bus samples are interpreted as integer values. Alternately, as mentioned above, a user can calculate a different set of data from the bus samples. For example, the user can specify that a fast-Fourier transform of a set of bus data be calculated and displayed as a plot of analytical results tile.

Another type of tile is the specification checking tile, such as a delay specification checking tile. An important part of verifying an electronic circuit's performance characteristics (e.g., performance of an integrated circuit chip) involves checking every transition of an input or output signal to ensure the satisfaction of a set of maximum and/or minimum timing constraints.

These timing constraints can, for example, be specified in terms of the minimum and/or maximum delays of a given signal relative to another signal. A delay tile provides this checking function, showing the distribution of delays from minimum to maximum constraints. For example, this type of tile can analyze the times at which a given signal changes state, and then compare those times with pre-specified delay constraints. The delay tile can therefore show whether any transitions have been too fast or two slow. The user is then graphically provided with a summary of how often the signals occur outside given constraints (i.e., specifications) and whether the transitions are close to being outside the constraints.

FIGS. 6(a) and 6(b) show two delay tiles for checking the same signal of a circuit design with different minimum and maximum delay numbers. In FIG. 6(b), minimum and maximum delay values are shown as "2" and "5", respectively. A bar chart shows the frequency of occurrence of legal transitions (i.e., those which neither fall below the minimum nor rise above the maximum), placed in ten equally spaced bins. The height of the bars represents the number of legal transitions with given delay.

FIG. 6(a) shows a delay tile that corresponds to that of FIG. 6(b). Although the minimum and maximum delays of FIG. 6(a) are not shown, they would be different from those of FIG. 6(b) for identifying the number of legal transitions within a more narrow or within a broader range of delay constraints. Again, the height of each bar between these limits represents the number of legal transitions with a given delay relative to a specified signal. FIG. 1 illustrates a specification checking tile 76 in the control panel.

As mentioned previously, known techniques can be incorporated into tiles of a control panel to further illustrate circuit operation during simulation. The first known technique mentioned above was the use of a waveform display. The use of a waveform display for a given tile is self explanatory. For example, a waveform display tile can illustrate a sampled analog signal present at a given node during the simulation. Similarly, annotations can be superimposed on gate level schematics to form yet another type of tile for inclusion in a control panel such as illustrated by tile 78 in the FIG. 1. Known logic analyzer types of display can also be included as control panel tiles.

As mentioned previously, textual interpretations can be defined by the user to derive additional information from the control panel tiles. In a preferred embodiment, a textual interpretation method is provided to analyze a set of signals and to produce a readable text version therefrom. For example, the above described logic analyzer tiles, animation tiles and waveform tiles can have their results further interpreted so that additional information derived from the simulation results can be annotated onto the tiles. This added information affords the user a more meaningful description of circuit operation during simulation.

An exemplary textual interpretation method analyzes a set of bits obtained as simulation results, and extracts sub-fields from the set for interpretation in different ways. The different sub-fields are then combined with some literal text to create the final information displayed in a tile.

As a simple example, consider a user input that describes how to go from an 8 bit simulation result to a register transfer-like text notation is as follows:

```
define r(*) r[udecimal(*)]
if opcode (8)
    00dddsss : @r(d) <— @r(d) + @r(s)
    01dddsss : @r(d) <— @r(d) — @r(s)
    10dddsss : @r(d) <— @r(d) & @r(ss)
    11000sss : print (@decimal (s))
    11?????? : noop, ??? = @ubinary (5,4:1,0)
end
```

There are two parts to this particular notation: the "define" part and the "if" part. "Define" is a simple macro expansion. The bits coming in as simulation results are passed on down to another macro (udecimal), the literal text "r[" being added in front, and the literal text "]" being added on the back of this latter macro. Udecimal is a built in function that interprets a set of bits as an unsigned decimal number.

"If" provides a pattern matching and sub-field extraction mechanism. Each line of the if expression consists of two parts: the match pattern to the left of the colon, and the text to be displayed in a tile to the right. The match pattern must have the same number of non-blank characters as the number of bits being received as a simulation result. Constant 0s and 1s in the match pattern must match the simulation result exactly for that pattern to coincide with the input value Other characters in the match pattern act as sub-field extractors for specifying two sub-fields: destination, d and source s. The sub-fields can be referred to in the text result on the right, specifically as arguments to other macros. A question mark is a "don't care" signal. Matching is accomplished by searching through the list of match patterns in sequence until a match is detected with the simulation result being considered. Only those bits with 0s or 1s specified are used to detect a match.

For example, if the value 00001100 is received as a simulation result and analyzed using the "opcode" interpretation described above, then the first match pattern matches (because the first two bits are 00). The sub-field destination address ddd is then set equal to 001, and the sub-field source address sss is set equal to 100. These addresses are then passed into the macro 'r', giving the final text value as:

$$r[1] < -r[1] + r[4]$$

This final text value can be annotated onto a tile to signify the addition of stored values. This text interpretation thus enables the simulation results to be combined with textual annotations for a display in given tile. Further, the match pattern associated with a given simulation result can be used to access textual expressions encoded in source and destination registers addressed by the destination and source sub-fields. Using this technique, larger expressions can be built up from relatively basic expressions.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. Using a computer, a method for presenting to a user intermediate and final results of computer simulation and analysis of designs for integrated circuits, comprising the steps of:

accepting a user definition of a user-defined control panel display composed of tiles including at least one of:
   a datapath compiler tile depicting a datapath and, apart from depiction of said datapath, representing data flow through said datapath in a current logic state;
   a logic synthesizer tile depicting a logic state diagram and representing a current logic state;
   an analytical results tile depicting a functional relationship between two circuit variables; and
   a specification tile depicting specified circuit parameter limits and representing a degree to which said specified circuit parameter limits have been met;
said method comprising the further steps of:

causing a circuit design simulation to be executed on said computer;

indexing simulation results for distribution to appropriate tiles of the user-defined control panel display;

distributing simulation results to appropriate tiles of a user-defined control panel display; and, modifying at least one tile to illustrate the simulation results.

2. A method according to claim 1 wherein two or more tiles are modified with the same simulation results.

3. A method according to claim 1 wherein at least one tile annotates simulation results onto a logic synthesizer input.

4. A method according to claim 1 wherein at least one tile annotates simulation results onto a silicon compiler input.

5. A method according to claim wherein at least one tile is created by selecting a drawing in response to the simulation results, the drawing being further annotated during the step of modifying.

6. A method according to claim wherein the drawing is selected from among a plurality of drawings entered by the user prior to the simulation.

7. A method according to claim 1 wherein at least one tile represents a plot of simulation results.

8. A method according to claim 7 wherein the plot is created by modifying the simulation result via a user defined calculation.

9. A method according to claim 1 wherein at least one tile checks circuit design specifications.

10. A method according to claim 9 wherein predefined delay constraints are used to verify timing specifications of the circuit design.

11. A method of analyzing the results of an electronic circuit design simulation, comprising the steps of:

defining characteristics of the tiles designed to display electronic circuit simulation results using predetermined formats, said tiles including at least one of:

a datapath compiler tile depicting a datapath and, apart from depiction of said datapath, representing data flow through said datapath in a current logic state;

a logic synthesizer tile depicting a logic state diagram and representing a current logic state;

an analytical results tile depicting a functional relationship between two circuit variables; and a specification tile depicting specified circuit parameter limits and representing a degree to which said specified circuit parameter limits have been met;

said method comprising the further steps of:

interpreting simulation results into user defined text or pictures according to said defined characteristics of said tiles; and modifying at least one of the tiles using the interpreted simulation results.

12. A method according to claim 11 wherein the characteristics represent a user defined calculation routine.

13. A method according to claim 11 wherein the characteristics represent a user defined set.

14. A method according to claim 11 wherein the characteristics represent user defined timing constraints.

15. A method according to claim 11 wherein the characteristics represent user defined annotations which are added to the at least one tile.

16. Using a computer, a method for presenting to a user intermediate and final results of computer simulation and analysis of designs for integrated circuits, comprising the steps of:

accepting a user definition of a user-defined control panel display composed of tiles including at least one of:

a datapath compile tile depicting a datapath and, apart from depiction of said datapath, representing data flow through said datapath in a current logic state;

a logic synthesizer tile depicting a logic state diagram and representing a current logic state;

an analytical results tile depicting a functional relationship between two circuit variables; and a specification tile depicting specified circuit parameter limits and representing a degree to which said specified circuit parameter limits have been met;

said method comprising the further steps of:

causing a circuit design simulation to be executed on said computer;

indexing simulation results for distribution to appropriate tiles of the user-defined control panel display;

distributing simulation results to appropriate tiles of a user-defined control panel display; and, modifying at least one tile to illustrate the simulation results.

17. A method according to claim 16 wherein the sub-field information identifies human readable language for modifying the at least one tile.

18. A method according to claim 16 wherein the step of modifying further includes a step of decoding simulation results into human readable text for annotation on the drawing.

* * * * *